(12) United States Patent
Nakamura

(10) Patent No.: US 7,330,033 B2
(45) Date of Patent: Feb. 12, 2008

(54) NONCONTACT SENSOR

(75) Inventor: Yoshitaka Nakamura, Aichi (JP)

(73) Assignee: Nippon Kouatsu Electric Co., Ltd., Aichi (JP)

( * ) Notice: Subject to any disclaimer, the term of this patent is extended or adjusted under 35 U.S.C. 154(b) by 0 days.

(21) Appl. No.: 10/565,641

(22) PCT Filed: Mar. 30, 2004

(86) PCT No.: PCT/JP2004/004575

§ 371 (c)(1),
(2), (4) Date: Aug. 11, 2006

(87) PCT Pub. No.: WO2005/010536

PCT Pub. Date: Feb. 3, 2005

(65) Prior Publication Data

US 2007/0031618 A1    Feb. 8, 2007

(30) Foreign Application Priority Data

Jul. 25, 2003    (JP) .............................. 2003-280119

(51) Int. Cl.
*G01R 31/08* (2006.01)
(52) U.S. Cl. ..................................... 324/522; 324/547
(58) Field of Classification Search ................ 324/457, 324/72.5, 72, 522, 547
See application file for complete search history.

(56) References Cited

U.S. PATENT DOCUMENTS 3,774,108 A    11/1973    Ogilvie
4,386,315 A  *  5/1983    Young et al. ................ 324/120
4,636,732 A  *  1/1987    Willis ........................ 324/425
4,839,581 A  *  6/1989    Peterson, Jr. ................ 324/72
5,915,150 A  *  6/1999    Kukimoto et al. .......... 399/149

FOREIGN PATENT DOCUMENTS

| DE | 1134157 B1 | 8/1962 |
| EP | 0222278 A1 | 5/1987 |
| JP | 62-201368 A | 9/1987 |
| JP | 6-39342 Y2 | 10/1994 |
| JP | 2003-161755 | 6/2003 |

* cited by examiner

*Primary Examiner*—Vincent Q Nguyen
(74) *Attorney, Agent, or Firm*—Morgan, Lewis & Bockius LLP

(57) ABSTRACT

A noncontact voltage sensor is housed in a container comprising a container body having an opening on one side and an insulation cover body for sealing the opening. A plate type electrode insulated from a ground is housed in the container. The cover body side is opposed to a charging part of such as cables of an aerial line. A voltage is induced in the plate type electrode due to aerial electric charges between the charging part and the plate type electrode in the container, allowing detection of the voltage in the charging part. The cover body of the noncontact sensor is made of a fluorine containing resin such as an ethylene tetrafluoride resin to prevent a water film from forming on the outside surface of the insulation cover body and causing deterioration of the detection.

10 Claims, 8 Drawing Sheets

NONCONTACT SENSOR

TECHNICAL FIELD

The present invention relates to a noncontact sensor that is used in a monitoring device for an overhead transmission/distribution wire line, or in a system for an inter-failure-region standardization or a failing-point standardization, etc. and that is installed on a transmission wire line steel tower. More particularly, the present invention relates to a noncontact sensor that, even in a rainy weather, can maintain a detection performance.

BACKGROUND ART

In a case where a failure has occurred on an overhead transmission/distribution line, the surge signal that occurs due to the failure is detected by a failure-detecting sensor provided on the overhead transmission/distribution line. And, failure standardization for standardizing the inter-failure-region or failing position is conducted by using the difference between each two times at which the surge signals arrive, etc. As a method of detecting the surge signal to determine a relevant failure, there are the method of measuring a line current, line voltage, etc. by using a sensor directly connected to the overhead transmission/distribution line such as a current transformer (CT), a potential transformer for using on gages (PT, PD), etc., the method of measuring a line current, line voltage, etc. by using a noncontact sensor such as a magnetic sensor that detects the magnetic field that occurs due to the electric current and an electric field sensor that detects the electric field that occurs due to the voltage, and so on.

This applicant previously proposed a noncontact sensor that is arranged to be used by being installed on an overhead transmission/distribution line steel tower (refer to, for example, a Japanese official gazette of Japanese Patent Application Laid-Open No. 2003-161755<pages 3-4, FIG. 2>). This is made up into a structure in which an electric-current sensor that detects the change in the spatial magnetic field due to the electric current passing through the overhead transmission/distribution line and that is comprised of a core and coil and a voltage sensor that detects by a plate electrode the line voltage capacitance-divided by the spatial charge between an electrically charged portion of the overhead transmission/distribution line and a plate electrode insulated from the earth, both, are accommodated in a hermetically sealed sensor container. Also, the sensor container consists of a container main body that is formed using a non-magnetic material such as stainless steel and one side of that is opened, and a lid member that hermetically seals the opening portion and that is formed using insulative synthetic resin such as vinyl chloride resin and polyethylene resin. This noncontact sensor is used by being secured to a transmission steel tower side surface in such a manner as the lid-member side comprised of the insulative synthetic resin is opposed to the electrically charged portion of the transmission line that provides a measured phase.

THE PROBLEM THAT THIS INVENTION IS TO SOLVE

However, since, in the above-described sensor container, no consideration is given even to the water repellency of the surface of the outside of the lid member, there occurs a case where, in a rainy weather, an electrically conductive water film layer is formed over the entire outside surface of the lid member due to the fall of rain and as a result the water film layer becomes bridged over the lid member and the container main body. When, like this, part of the water film layer contacts with the container main body with the result that the whole of the outside surface of the lid member has the same potential as the earth potential, it is possible that the sensor signal from the above-described voltage sensor provided within the sensor container will become very small. As a result, there is a case where difficulty is encountered in detecting the state of the overhead transmission/distribution line. Especially, in the case of standardizing a failure position due to the thunder surge, the water film layer becomes liable to be formed due to a heavy thunderstorm. As a result, there is a case where more difficulty is encountered in detecting the signals in the course of thunder-surge failure.

The present invention solves the above-described points of problem and the object of the invention is to provide a noncontact sensor that, even during a rainy weather, can maintain the sensor performance.

DISCLOSURE OF THE INVENTION

The present invention is as follows.

1. A noncontact sensor comprising a container including a container main body having an opening portion at one side and an insulative lid member that hermetically seals said opening portion of said container main body, and a voltage sensor disposed in said container in the way in which a lid member side is opposed to an electrically charged portion of an overhead wire line, being insulated from the earth, and detecting a voltage that is induced in a plate electrode due to a spatial charge between said electrically charged portion and the plate electrode within said container, characterized in that said lid member is a water-repellent resin.

2. A noncontact sensor comprising a container including a container main body having an opening portion at one side and an insulative lid member that hermetically seals said opening portion of said container main body, and a voltage sensor disposed in said container in the way in which a lid member side is opposed to an electrically charged portion of an overhead wire line, being insulated from the earth, detecting a voltage that is induced in a plate electrode due to a spatial charge between said electrically charged portion and the plate electrode within said container, characterized in that said lid member has a structure in which a water-repellent layer constructed using a water-repellent resin is provided on the whole or a part of its at least exposed surface.

3. The noncontact sensor according to the above-described item 2, wherein said water-repellent layer is formed with the use of a coating technique.

4. The noncontact sensor according to the above-described item 2, wherein the water-repellent layer is formed by adhering a sheet-like member or plate-like member consisting of the water-repellent resin.

5. The noncontact sensor according to the above-described items 1 to 4, wherein the water-repellent resin is fluorine resin or silicone resin.

6. The noncontact sensor according to the above-described item 5, wherein the lid member is designed in the way in which its peripheral edge is outwardly extended from a joined portion thereof to the container main body.

7. The noncontact sensor according to the above-described item 5, wherein the lid member further includes one, or two or more, consecutively protruding rib portions and/or groove portions.

8. A noncontact sensor comprises a container that is equipped with a container main body constructed in the way in which a surface excluding a detection surface opposed to an electrically charged portion of an overhead wire line is electro-magnetically shielded and a voltage sensor that is disposed in the container in the way in which the detection surface is opposed to the electrically charged portion of the overhead wire line, the voltage sensor being insulated from the earth to detect a voltage that is induced in a plate electrode due to a spatial charge between the electrically charged portion and the plate electrode within the container, characterized in that the detection surface has a structure in which a water-repellent layer constructed using a water-repellent resin is provided on the whole or a part of its at least exposed surface.

9. The noncontact sensor according to the above-described item 8, wherein the water-repellent resin is fluorine resin or silicone resin.

10. The noncontact sensor according to the above-described item 8 or 9, wherein the detection surface further includes one, or two or more, consecutively protruding rib portions and/or groove portions.

EFFECT OF THE INVENTION

According to the noncontact sensor of the present invention, by using water-repellent resin as the material of the lid member, the rainwater resulting from the fall of rain becomes brought into a state of water droplets due to its water repellency to drop down. Namely, a water film layer doesn't attach onto the surface of the lid member and is not formed as this water film layer, and it is possible to detect the voltage of the electrically charged portion as in a fine weather even when it rains. Especially, a signal can be detected with respect to even during the thunder surge failure following a violent thunderstorm, and it is possible to standardize the position where the thunder surge failure occurs.

According to the noncontact sensor of the present invention equipped with the lid member having the water-repellent layer, since the water-repellent layer consisting of the water-repellent resin is formed on the whole or a part of the outside surface of the lid member of the sensor container disposed in the way of being opposed to the electrically charged portion of the overhead wire line, even when a relatively inexpensive resin having inferior water repellency is used as the material of the lid member, the rainwater due to the fall of rain becomes brought into a state of water droplets owing to the water repellency of the water-repellent layer formed on the exposed surface. Therefore, the water film layer doesn't attach onto the surface of the lid member, and that layer is not therefore formed. Therefore, even when rain is falling, it is possible to detect the voltage of the electrically charged part as in the case of in a fine weather.

According to the noncontact sensor equipped with the container having the container main body of which the surface excluding the detection surface has been electro-magnetically shielded, as in the case of the noncontact sensor that uses the lid member as the detection surface, the voltage of the electrically charged portion can be detected even when rain is falling in the same manner as in a fine weather.

In a case of forming the water-repellent layer by coating the water-repellent resin, the water-repellent layer can not only easily be formed but the water-repellent layer can also be firmly secured to the lid member. Therefore, the noncontact sensor can be used over a long period of time without the water-repellent layer's being exfoliated or swollen, etc.

Also, in a case where adhering the sheet-, or plate-, like water-repellent resin to form the water-repellent layer on the lid member, the water-repellent layer can not only be easily formed on a necessary portion, but it is also possible to easily cope with an already-made arrangement.

Further, in a case of using fluorine resin or silicone resin as the water-repellent resin, since the angle of contact with water of these water-repellent resin is 90° or more, the lid member is difficult to be wetted with the water droplets. Therefore, the water film layer can be prevented from being formed and, even when the amount of rain is in a state of being larger, it is possible to detect the voltage of the electrically charged portion as when the weather is fine. Especially, by making the angle of contact with water 100° or more, the water droplets attached onto the surface can be made more spherical, so that it is possible to eliminate the water droplets as in the way in which they roll down, or etc.

In a case where the peripheral edge of the lid member is more extended than the joined portion thereof to the container main body, since the water film layer comes to be more difficult to be bridged between the lid member and the container main body, the output signal of the sensor is difficult to weaken easily.

In a case where the rib portions are provided on the lid member, the water film layer can be segmented by the rib portions. Therefore, even when the amount of rain is being large, the voltage of the electrically charged portion can be detected as when the weather is fine. Also, in a case where the groove portions are provided in the lid member, the water film layer can be segmented by the groove portions. Therefore, even when the weather is in a state of containing a larger amount of rain, the voltage of the electrically charged portion can be detected as when the weather is fine.

BEST MODE FOR CARRYING OUT THE INVENTION

Figure 2:
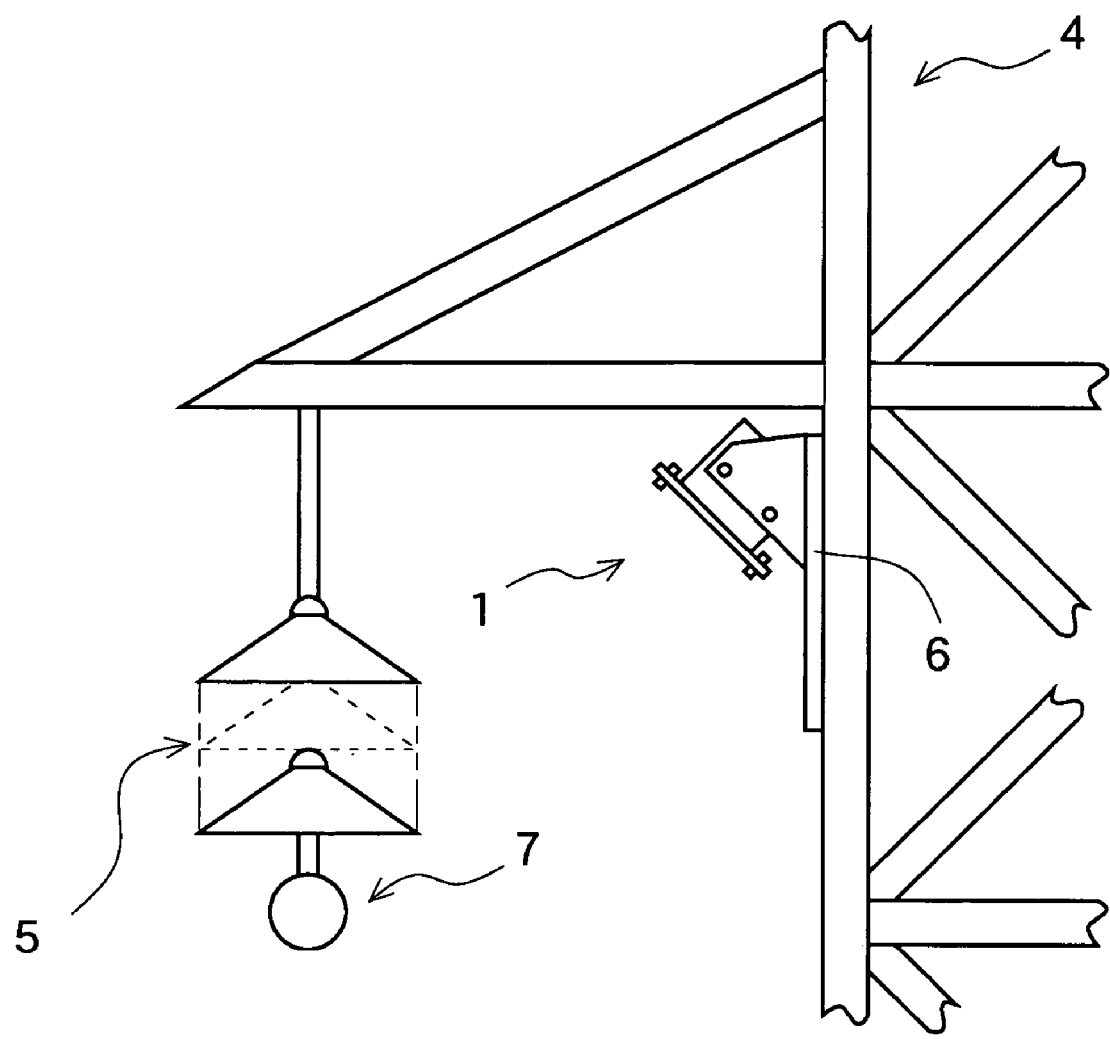
FIG. 2 is a typical view illustrating a state of use of the noncontact sensor according to the first embodiment of the present invention.
Figure 3:
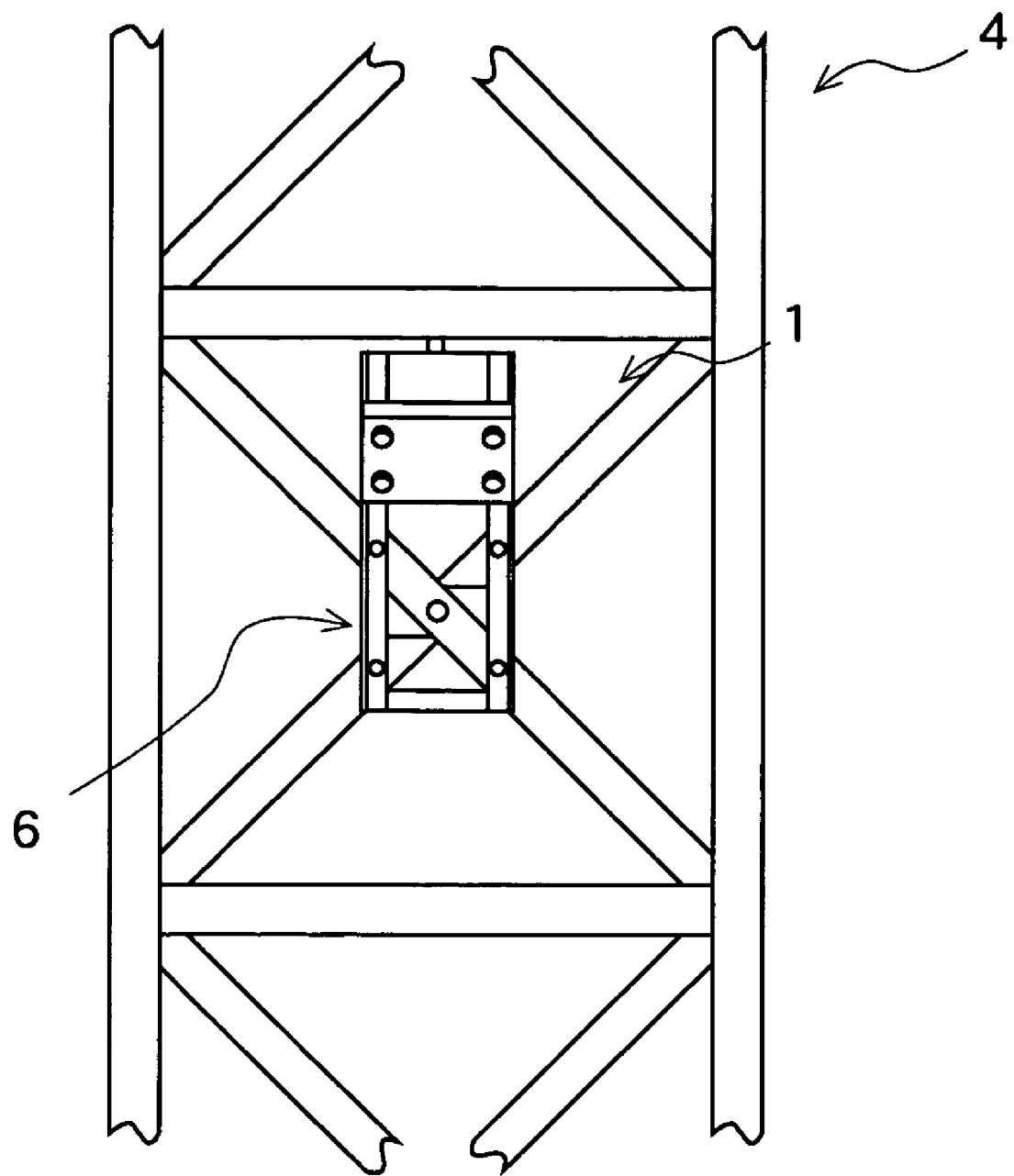
FIG. 3 is a typical view illustrating the state of use the noncontact sensor according to the first embodiment of the present invention.

Hereinafter, a noncontact sensor of the present invention will be explained with reference to FIGS. 1 to 7. This noncontact sensor, as exemplified (hereinafter illustrated) in, for example, FIG. 1, comprises a container main body 2, a lid member 3, and a voltage sensor 11. This noncontact sensor, as illustrated in FIGS. 2 and 3, is fixed to a transmission/distribution steel tower 4 via a metal fitting 6. The noncontact sensor is used in the way in which the voltage sensor 11 is disposed in such a manner as the voltage sensor 11 opposes an electrically charged part of an electric wire 7 of the overhead transmission/distribution wire line.

The above-described "container main body" is a container in which a plate electrode and the like are accommodated and which shields so that they are not affected by a surplus magnetic field and a surplus electric field. The container main body like this can be made of metal such as stainless steel and aluminium. Also, the container may be a resin-made container on which an electrically coating material and the like are coated so as to add an effect of shielding an electric field, etc.

Also, it is possible to provide an electrically conductive surface on an arbitrary surface of the container main body. The electrically conductive surface is used as a part constituting the voltage sensor. Also, the electrically conductive surface is provided at a surface that opposes the flat plate-like electrode.

The "lid member" functions so as to prevent dust or water from entering the container main body. The lid member is fabricated, ordinarily, by using synthetic resin and, without shielding the magnetic field and the electric field formed by the transmission/distribution wire lines, can thereby cause them to arrive at the flat electrode, etc. Further, in a case of making one surface of the container main body a detection surface for detecting the passage of electricity of the transmission line through the use of the voltage sensor and electric current sensor, the lid member is not limited to being the one manufactured using synthetic resin but can also be made the one manufactured using metal.

Also, the lid member can be fabricated using a water-repellent resin. Further, the lid member can also be constructed using a non-water-repellent synthetic resin layer and an exposed water repellent layer, the whole or a part of the non-water-repellent synthetic resin being covered by the water-repellent resin. The water-repellent layer constructing the lid member can be provided using the following arbitrary means. For example, on the non-water-repellent layer, a water-repellent layer consisting of a water-repellent resin can be coated and formed. Also, a plate-like water-repellent resin can be adhered using adhesive. Further, by screwing, a plate-like water-repellent resin can be fixed. Also, by adhering a sheet-like water-repellent resin and, thereafter, by adhering on it, a plate-like water-repellent resin, a concavo-convex configuration can easily be provided on the outside surface of the lid member. This concavo-convex configuration further can prevent the formation of the water film layer covering the whole of the outside surface of the lid member.

This "water-repellent resin" may be a material which is hard to form on its surface a water film layer, and fluorine resin and silicone resin are preferable in particular. Also, as the fluorine resin, the following examples are given: polytetrafluoroethylene (hereinafter referred to as "the PTFE"), a copolymer of tetrafluoroethylene and hexafluoropropylene (hereinafter referred to as "the FEP") and a copolymer of ethylene and tetrafluoroethylene (hereinafter referred as "the ETFE") and the like. Among them, fluorine resin having the water repellency that is especially higher as compared with other water-repellent resins is preferable. Also, it is preferable that the angle of contact with water should be 90° or more (preferably 100° or more). By using a resin the angle of contact with water of which is 90° or more, as compared with vinyl chloride resin (the angle of contact with water of which is approximately 70°) and polyethylene resin (the angle of contact with water of which is approximately 80°) and etc., the lid member is difficult to be wetted by water droplets, thereby preventing the water film layer from being formed. Especially, by making the angle of contact with water 100° or more, the water droplets which are attached to the surface can be made more spherical, and, also, the water droplets can be removed in such a manner that, for example, they roll down.

The thickness of the lid member can be set at an arbitrary value, for example, can be 1 mm to 30 mm. Also, the thickness of the lid member may not be uniform. Especially, in a case where a peripheral edge is tinned, the peripheral edge becomes a sharp end and therefore the water droplets are difficult to be bridged between the obverse and reverse surfaces. As a result thereof, the water film layer formed on the surface of the lid member does not continue up to the container main body, which is suitable for the present invention.

Also, rib portions 33 (for example, see FIG. 6) can be provided on the detection surface of the lid member 3 or the container main body 2. These rib portions 33 are consecutive protrusions that are provided on the detection surface of the lid member 3 or the container main body 2, so that a shielded portion not which is not directly exposed to the wind and rain can be formed. Accordingly, the water droplets become difficult to be connected to each other, so that the water film layer gets broken off. As a result thereof, the whole of the detection surface of each of the lid member 3 and container main body 2 is stopped from being subject to electrical conduction.

Further, groove portions 35 (for example, see FIG. 8) can be provided on the detection surface of the lid member 3 or the container main body 2. Since these groove portions 35 are provided on the detection surface of the lid member 3 or the container main body 2, the groove portion 35 serves as a boundary, so that the water droplets become difficult to be mutually consecutive, and for this reason, the water film layer is segmented, so that the whole of the detection surface of the lid member 3 or the container main body 2 is prevented from becoming electrically conductive.

Figure 5:
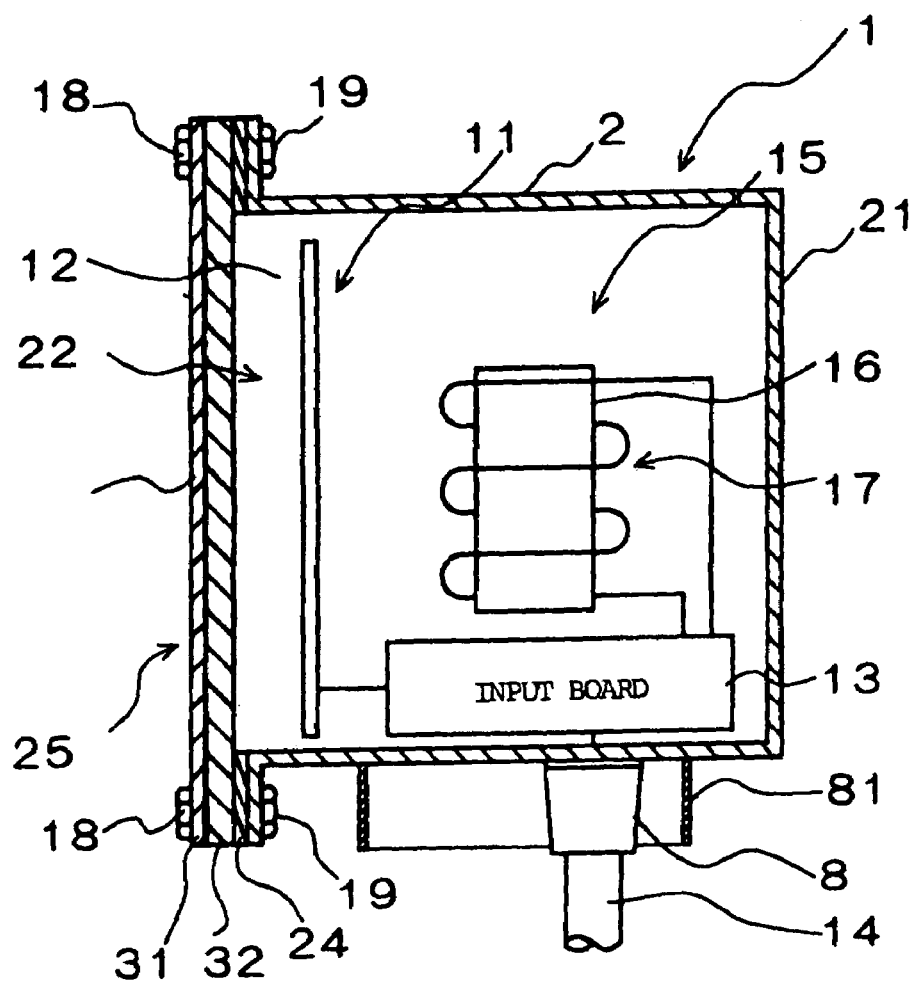
FIG. 5 is a typical sectional view illustrating a structure of a noncontact sensor according to a second embodiment of the present invention.

The noncontact sensor, as illustrated in FIG. 5 as the sensors for detecting the state of the transmission/distribution wire line, can be further equipped with an electric current sensor 15 in addition to the voltage sensor 11.

The above-described "voltage sensor" needs only to measure, with no contact, an absolute value, or a relative value, of the potential that is electrically passed through the transmission line. So, as that voltage sensor, any can be arbitrarily selected. As this example, a pyroelectric type can be taken up in addition to a vibrating capacity type.

Cited as this example a vibrating capacity type voltmeter based on the use of a capacitor that is constructed using an electrically conductive container bottom surface 21 functioning as the earth and a metal-made plate electrode 12 that is disposed parallel with the container bottom surface 21. This vibrating capacity type voltmeter comprises a spatial capacitance $C_1$ formed using an electric wire of the transmission line and the plate electrode provided in the way in which it is insulated from the earth and a capacitance $C_2$ between the plate electrode 12 and the earth. As a result of the capacitors C1 and C2, the plate electrode 12 is brought to a state of its being electrically connected to the electric wire. Simultaneously, a line voltage of the electric wire that has been divided by the spatial capacitance C1 and the capacitance C2 occurs on the plate electrode 12. Accordingly, it is possible to measure, in a state of no contact's being made, the line voltage of the electric wire 7 by measuring the voltage of the plate electrode 12.

The above-described "the electric current sensor" sufficiently serves the purpose only if it can measure, with no contact system being used, the absolute value or the relative value of the electric current flowing through the transmission line. So, as that sensor, any type can arbitrarily be selected. For example, a type of using a magnetic sensor that measures magnetism that occurs followed by the passage of the electric current can be cited.

Also, as this magnetic sensor, there are a magnetic sensor prepared by a coil's 17 being wound around a core 16, and a sensor that uses a Hall element or a magneto-resistive element, etc.

1. FIRST EMBODIMENT (1) Configuration of Noncontact Sensor

The noncontact sensor of the first embodiment is a noncontact type sensor for detecting the state of the transmission/distribution electric wire line, which is comprises a lid member made using a water-repellent resin as well as with a voltage sensor.

Figure 1:
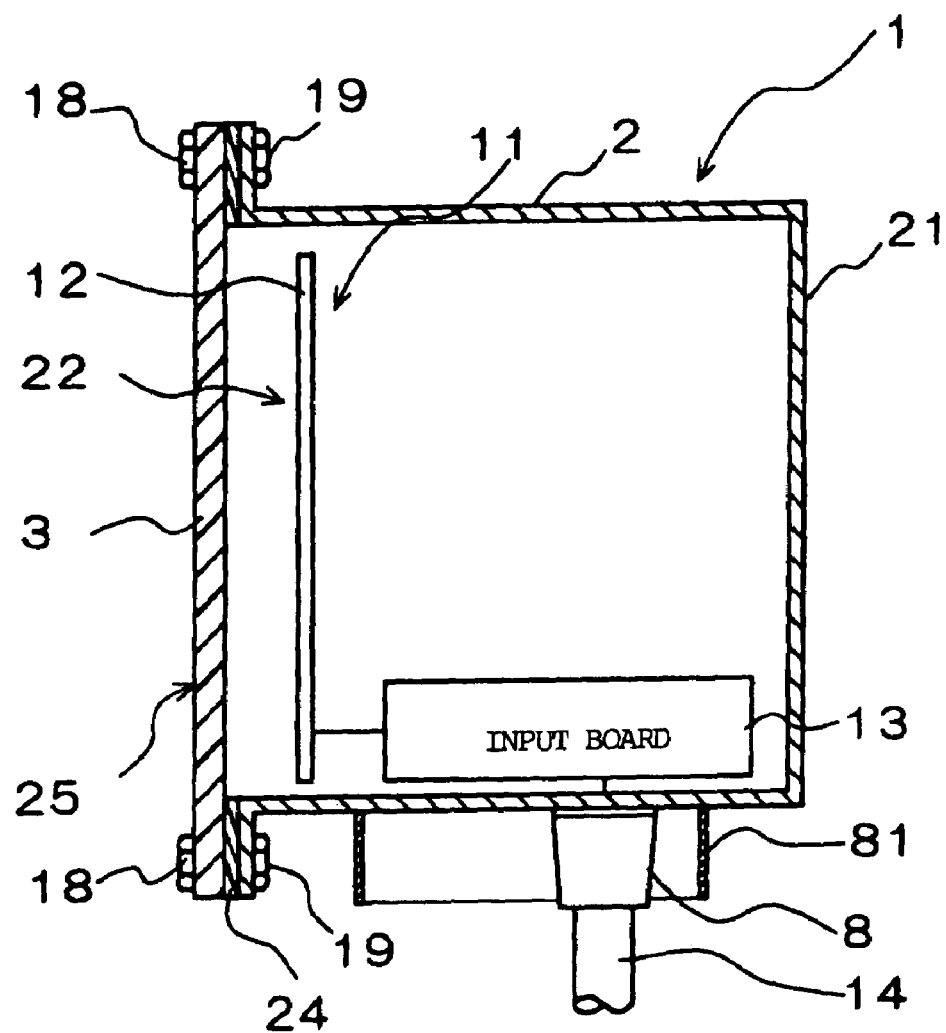
FIG. 1 is a typical sectional view illustrating a structure of a noncontact sensor according to a first embodiment of the present invention.

The noncontact sensor 1, as illustrated in FIG. 1, comprises with a container main body 2, the lid member 3, and the voltage sensor 11. The container main body 2 is a substantially rectangular parallelepiped-like vessel having an opening portion 22 constructed using metal or synthetic resin.

The lid member 3 is a PTFE-made flat plate whose thickness is 10 mm. The voltage sensor 11 is constructed of a substantially flat plate-like, or a substantially curved plate-like, plate electrode 12 and an input board 13. The plate electrode 12 is disposed in parallel with a container bottom surface 21 located on a side opposite to the side where the opening portion 22 is located and, in a state where it is insulated from the earth by an insulating member not illustrated, is secured to the container main body 2. Also, the input board 13 has an end electrically connected to the earth, is disposed between the plate 12 and the container bottom surface 21, and is secured, in this condition, to the container main body 2.

The opening portion 22 of the container main body 2 is made so constructed that a bolt 18 and nut 19 are secured to the lid member 3 with a packing 24 such that the interior of the container main body 2 may be hermetically sealed, the lid member 3 shaped like a substantially flat plate, or a substantially curved plate, made of PTFE. The lid member 3 is made of the PTFE material whose water repellency is high, and, since the angle of contact with water is approximately 110°, the water attached onto the surface is brought to a state of independent water droplet. Also, the bolt 18 and the nut 19 are each made of synthetic resin having an insulative property. Regarding the bolt 18 and nut 19, it may not be constructed using resin only if the water film layer formed on the surface of the lid member is not electrically conductive to the container main body 2, i.e. insulated therefrom. Namely, that may be ceramics material, or the like.

(2) Method of Using Noncontact Sensor

Next, a method of using the noncontact sensor 1 will be explained. As illustrated in FIGS. 2 and 3, the noncontact sensor 1 is secured, by the metal fitting 6, to the side surface of the transmission steel tower 4 so that the lid member 3 side, on which the plate electrode 12 is located parallel to the lid member 3, may be opposed to the electric wire 7 of the transmission line, the electrically charged portion to be measured, which is insulated and supported via a plurality of suspension insulators 5, by the side surface of the transmission steel tower 4. Also, the reason why opposing the lid member 3 side to the electric wire 7 is that the spatial capacitance C1 is formed by the spatial charge between the plate electrode 12 and the electric wire 7.

In the voltage sensor 11 of the noncontact sensor 1 provided in this way, the plate electrode 12 is brought to a state of having been electrically connected to the electric wire 7 due to the spatial capacitance C1 formed by the electric wire 7 of the transmission line and the plate electrode 12 provided in a state of being insulated from the earth and the capacitance 2 between the plate electrode 12 and the earth. As a result thereof, the line voltage of the electric wire 7 divided by the spatial capacitance C1 and the capacitance C2 occurs between the plate 12 and the earth. For this reason, by measuring the voltage of the plate electrode 12, the line voltage of the electric wire 7 becomes able to be detected in a state of noncontact therewith. Further, by detecting the line voltage, it is possible to detect the breakage of the wire line and the thunder surge that occurs due to the fall of a thunderbolt.

The voltage that has occurred between the plate electrode 12 and the earth is delivered into the input board 13. In the input board 13, the voltage that has been obtained is converted to an output signal having a prescribed signal level. This output signal is sent into an appliance such as a control device, not illustrated, which is installed at a lower part of the transmission steel tower 4 via a signal cable 14 connected to a connector 8 provided in a hermetically sealed sate by passing through the container main body 2. Thereafter that output signal is used for monitoring the transmission line, inter-failure region standardization, failing-point standardization, etc. Incidentally, provided on the connector-8-attaching-surface of the container main body 2 is a connector-protecting cover 81.

Incidentally, on the above-described control device, a communication facility, external display function, etc. can be also provided. In addition, it is also possible to deliver necessary information signals such as line information, failure information, etc. to a branch office, power station, maintenance service cars, etc. of, for examples, a power company, and also to cause display of them to the outside.

Also, since as the lid member 3 there is used the PTFE that is the water-repellent resin the angle of contact with water of which is approximately 110°, the noncontact sensor has excellent water repellency. Therefore, the main water that has attached onto the surface of the lid member 3 due to the fall of rain is brought to a state of water droplet to fall down. So, it is possible to prevent the rainwater from becoming the water film layer and attaching onto the surface of the lid member 3. Therefore, it doesn't happen that the water film layer is formed on the lid member 3 and container main body 2 due to the fall of rain and the entire vessel comes to have the earth potential. Therefore, even in rainy weather, the line voltage of the electric wire 7 can be detected through the use of the plate electrode 12 as in a fine weather. Especially, even in a violent thunderstorm weather where a thunder surge failure is liable to happen, the detection becomes possible and it is possible to detect a thunder surge failure signal resulting from the thunderstorm to standardize the position where a thunderbolt fall.

(3) Test on Sensor Output Characteristics

To confirm the effect of the above-described noncontact sensor, a test on sensor output characteristic during the fall of rain was conducted.

Figure 4:
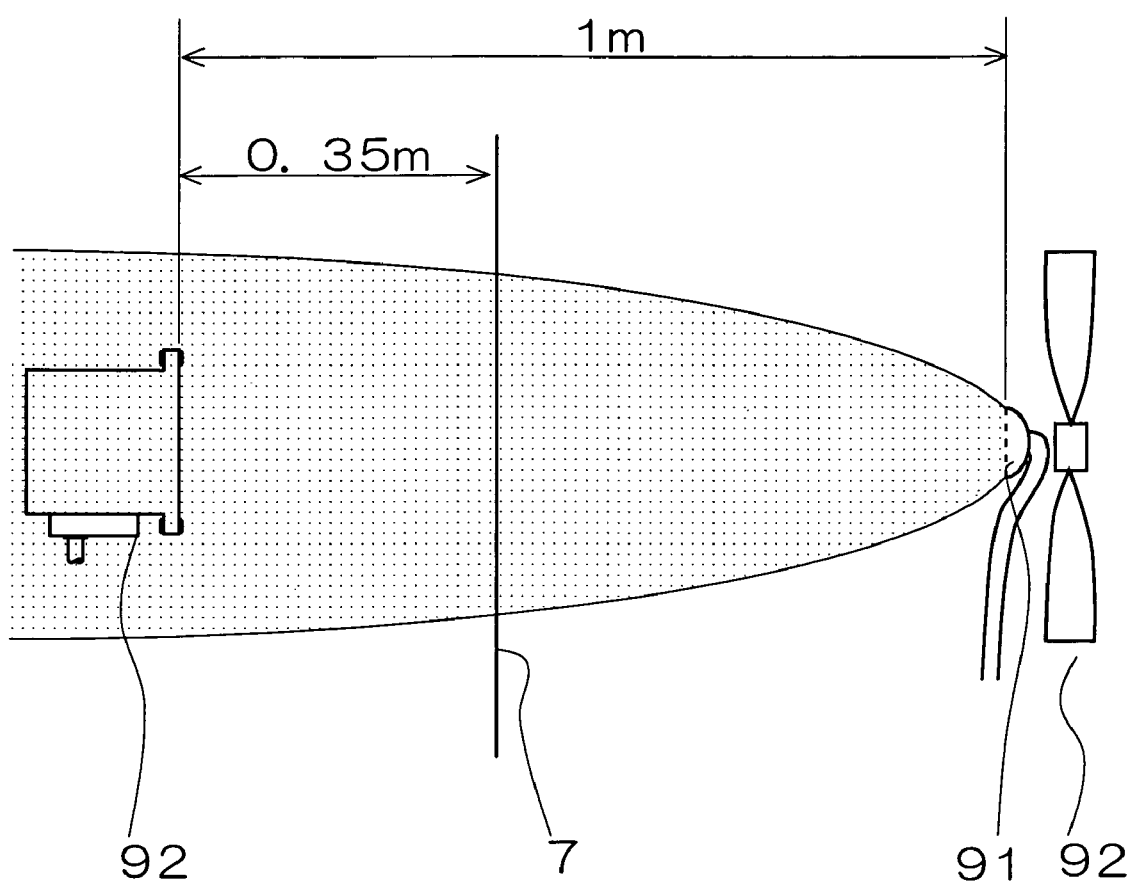
FIG. 4 is a typical view illustrating a test that has been conducted on the noncontact sensor according to the first embodiment of the present invention.

In this characteristic test, as illustrated in FIG. 4, water was scattered over the noncontact sensor 1 for detecting the voltage of the electric wire 7 by using a sprinkler 91 scattering water in drops and an air blower 92, so that the variation in the sensor output value were observed. Also, the test was deemed to finish when the output voltage reached 15% of the level at which the test had been started. The time passage was deemed to be the result. As the rainfall, while the conditions on the falling amount of rain and the wind speed were being varied, the rainfall was conducted by the sprinkler 91 and the air blower 92 from the position spaced by 1 m away from the noncontact sensor 1. The distance from the transmission/distribution line to the noncontact sensor was made to be 0.35 m; and the line voltage was made to be 7.8 kV. The results obtained were converted so that the distance was 2 m and the line voltage was 77 kV/√3. The results above are shown in Table 1.

TABLE 1

|  |  | Falling amount of rain per hour (mm/h) | |
| --- | --- | --- | --- |
| Wind speed (m/s) |  | 7.5    14 | 60 |
| 2 | The amount of time until | — No change occurs for 600 seconds. | No change occurs for 600 seconds. |
| 4 | Interruption of the service (sec.) | — No change occurs for 600 seconds. | No change occurs for 600 seconds. |
| 6 |  | — No change occurs for 600 seconds. | No change occurs for 600 seconds. |

Further, the noncontact sensor whose lid member is made from polyvinyl chloride is prepared as a comparative example and the sensor output characteristics test under the same condition as that of the embodiment was conducted. The test result is shown in Table 2.

TABLE 2

|  |  | Falling amount of rain per hour (mm/h) | |
| --- | --- | --- | --- |
|  | Wind speed (m/s) | 7.5 | 14 |
| 2 | The amount of time until | 325 | 201 |
| 4 | Interruption of the service | 66 | 37 |
| 6 | (sec.) | 75 | 45 |

As shown in Tables 1 and 2, it was proved that, by using the lid member that used a PTGE resin that was high in water repellency even when the falling amount of rain was 60 mm/h, measurement could be continued without the sensor output's decreasing for 10 minutes or more.

2. SECOND EMBODIMENT

The second embodiment employs a noncontact sensor that is equipped, as the sensor for detecting the state of the transmission/distribution line, with a voltage sensor and a current sensor.

(1) Configuration of Noncontact Sensor

The noncontact sensor of the second embodiment, as illustrated in FIG. 5, is so structured that the voltage sensor 11 and the current sensor 15 are accommodated, in a state of their being hermetically sealed, in the container main body 2 substantially shaped like a rectangular parallelepiped, which has a lid member 3 substantially shaped like a flat plate or a curved plate and an opening portion 22 constructed using a non-magnetic metal such as stainless steel and aluminium or a synthetic resin. Also, regarding the same elements or components as those of the first embodiment they are denoted by the same reference symbols and their explanations are omitted.

Also, the lid member 3 is comprised of a water-repellent layer 31 that is constructed using a PTFE plate and the thickness of that is 5 mm, and a non-water-repellent layer 32 that is constructed using an insulative synthetic resin such as vinyl chloride resin.

The opening portion 22 has a structure in which the lid member 3 is secured, by the bolt 18 and nut 19, via the packing 24. As in the case of the first embodiment, the noncontact sensor 1 is secured, by the metal fitting 6, to the side surface of the transmission/distribution line 4 in the way in which the lid member 3 side of the noncontact sensor 1 is opposed to the electric wire 7 of the transmission line, the electrically charged portion to be measured, which is insulated and supported, via a plurality of suspension insulators 5, by the side surface of the transmission steel tower 4.

The voltage sensor 11, as in the case of the first embodiment, is constructed of a substantially flat plate or a substantially curved plate electrode 12 and an input board 13. The signal from the plate electrode 12 is sent to the input board 13 and is thereby converted to a prescribed signal level that is easy to use, and is sent, via a signal cable 14, to the control device not illustrated. The plate electrode 12 is disposed in parallel with the opening portion 22 and the container bottom surface 21 on the opposite side and is secured to the container main body 2 by being insulated from the earth by an insulating member not illustrated. Also, the input board 13 has an end electrically connected to the earth, and is disposed between the plate electrode 12 and the container bottom surface 21 and is secured to the container main body 2.

The current sensor 15 is constructed of a core 16 that detects the variation in the spatial magnetic field and a coil 17 that is wound around the outer-peripheral surface of the core 16. And, by causing the generation in the coil 17 of the induced voltage that corresponds to the magnetic flux that occurs concentrically with the electric wire 7 due to the electric current passed through this electric wire 7, it is arranged that the electric current be detected. The current sensor 15, with the axial direction of the coil 17 disposed parallel with the container bottom surface 21, is secured to the vessel main body 2, between the plate electrode 12 and the container bottom surface 21, by using an attaching member not illustrated. Incidentally, when attaching to the side surface of the transmission steel tower 14, the current sensor 15 is disposed so that the axial direction of the coil 17 may be tangential to the magnetic flux generated concentrically with the electric wire 7 that is the phase to be measured.

Also, the core 16 is made of a magnetic material that uses ferrite, iron, Permalloy, etc. and, other than this, nonmagnetic material such as air-cored one. Regarding the shape thereof, a cylindrical configuration, a bar configuration, a rectangular configuration, etc. can be taken up as the examples. The output signal from the current sensor 15, also, is sent to the input board 13 of the voltage sensor 11 and is converted to a prescribed signal level that is easy to use, and is sent to the control device via the signal cable 14.

(2) Effect of Noncontact Sensor

On the whole surface, or a necessary portion, of the water-repellent layer 31 located on the outside surface of the lid member 3 disposed in the way of opposing the electric wire 7 formed is the water-repellent layer 31 constructed using the PTFE material the angle of contact with water of which is 90° or more (more preferably 100° or more). Therefore, the water that has attached onto the surface becomes shaped like an independent water droplet. By using a water-repellent member the angle of contact with water of which is 100° or more, the water that has attached onto the surface can be brought to an independent water droplet that is more spherical, and can thereby be made a water droplet to fall down. Incidentally, the water-repellent layer 31 may be provided on the outside surface of the container main body 2. It is also possible, as the water-repellent material, to use paraffin, etc. other than the materials described above.

Owing to the water repellency of the water-repellent layer 31 provided on the outside surface of the lid member 3, even when using a synthetic resin that is relatively inexpensive compared to the non-water-repellent layer 31 of the lid member 3 and the water repellency of that is bad, the rainwater resulting from the fall of rain becomes a water droplet to fall down. Thereby, the rainwater is prevented from becoming the water film layer on the outside surface of the lid member 3 and attaching onto it. Therefore, as in the case of the first embodiment, the outside surface of the lid member 3 is stopped from being covered by the water film layer the potential of which is the earth potential. Even in rainy weather, the line voltage of the electric wire 7 can be detected by the plate electrode 12 as in a fine weather. Especially, even in a violent thunderstorm where thunder surge failure takes place, the detection becomes able to be made, whereby standardization of the place where a thunderbolt falls can be made by detecting the thunder surge failure signal that follows the thunderstorm.

Incidentally, the water-repellent layer 31 can be formed by, after radiating an ultraviolet laser light onto the whole or a necessary portion of the outside surface of the lid member 3 with respect to which water repellency is performed and thereby performing pretreatment and then by coating the above-described water-repellency treatment agent consisting of fluorine system, or silicone system, resin such as PTFE, etc. As a result thereof, the water-repellent layer 31 can be easily formed on the whole or a necessary portion of the outside surface of the lid member 3 and, simultaneously, the water-repellent layer 31 can be secured to the lid member 3, whereby the water-repellent layer 31 can be used over a long period of time without its being exfoliated or swollen.

Also, the water-repellent layer 31 can be formed by adhering to the whole or a necessary portion of the outside surface of the lid member 3 the above-described water-repellent resin that consists of a sheet-, or a plate-, like fluorine system, or a silicone system resin, or the like. By forming, with adhesion, the water-repellent layer 31, the water-repellent layer 31 can easily be formed on the whole or a necessary portion of the outside surface of the lid member 3. On the other hand, simultaneously, the water-repellent layer 31 can easily be provided on an already-made noncontact sensor.

3. THIRD EMBODIMENT

Figure 6:
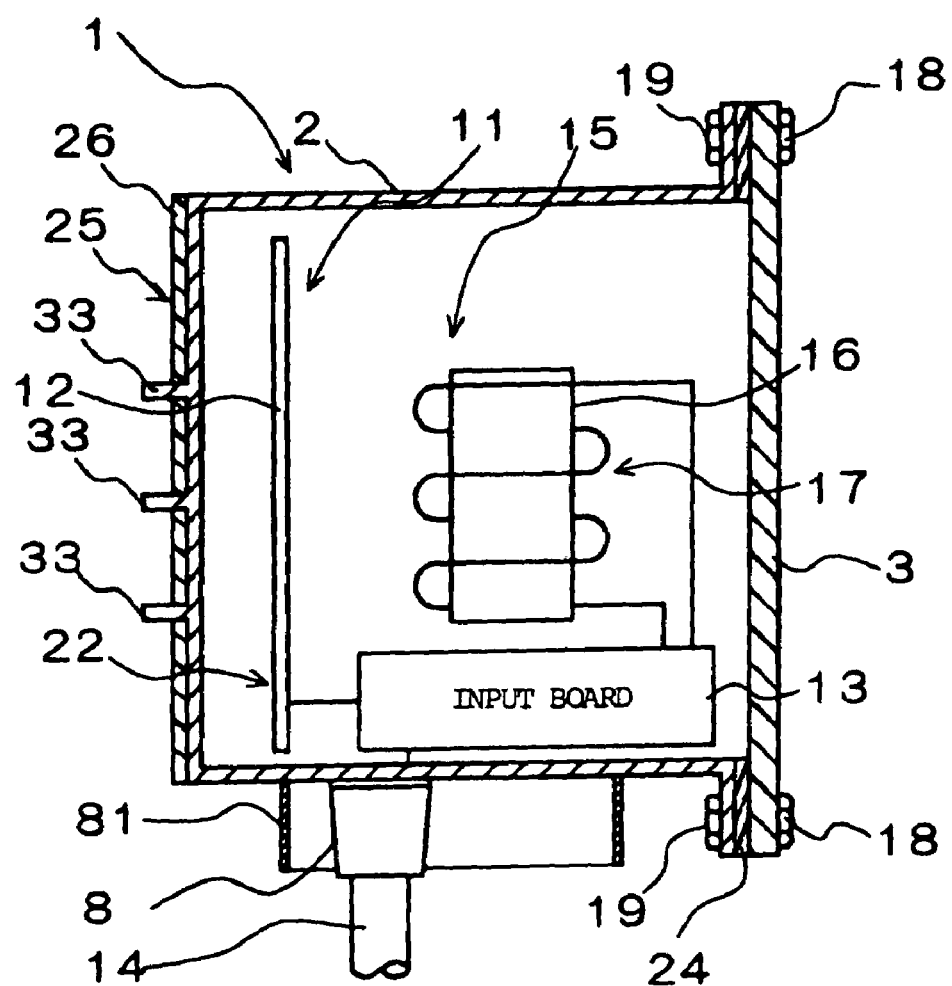
FIG. 6 is a typical sectional view illustrating the structure of a noncontact sensor according to a third embodiment of the present invention.

The noncontact sensor of the third embodiment, as illustrated in FIG. 6, is a noncontact type sensor with rib portions provided on the detection surface which is the bottom surface of the resin-made container main body.

(1) Configuration of Noncontact Sensor

The noncontact sensor 1 of the third embodiment has not only the current sensor 15 but also the voltage sensor 11. It is equipped with the vessel main body 2 that consists of insulative synthetic resin such as vinyl chloride resin and that is substantially shaped like a rectangular parallelepiped as well as with the lid member 3 that has provided at the opening portion 22 and that consists of synthetic resin and that is substantially shaped like a flat plate. The noncontact sensor 1 is thereby made up into a structure wherein the noncontact sensor 1 is hermetically sealed and accommodated into the space formed of the container main body 2 and the lid member 3.

Incidentally, the container main body 2 has a structure wherein the opening portion 22 of the container main body 2 is fastened, via the packing 24, by the bolt 18 and nut 19. As in the case of the first embodiment, the noncontact sensor 1 is secured, by the metal fitting 6, to the side surface of the transmission line tower 4 in the way in which the detection surface 25 of the vessel main body 2 is opposed to the electric wire 7 of the transmission line, the electrically charged portion to be measured, which is insulated and supported, via a plurality of suspension insulators 5, by the transmission steel tower 4.

The voltage sensor 11, as in the case of the first embodiment, is constructed of a substantially flat plate-like, or a substantially curved plate-like electrode 12, and the input board 13. The signal from the plate electrode 12 is sent to the input board 13 and is thereby converted to a prescribed signal level that is easy to use, and is sent, via a signal cable 14, to the control device. The plate electrode 12 is disposed in parallel with the detection surface 25 of the container main body 2 and is insulated from the earth by an insulating member not illustrated. Thereby, the plate electrode 12 is secured to inside the container main body 2. Also, the input board 13 has an end electrically connected to the earth, and is disposed between the plate electrode 12 and the container main body 2 and is secured to the container main body 2.

The current sensor 15, as in the case of the second embodiment, is constructed of a core 16 that detects the variation in the spatial magnetic field and a coil 17. And, by causing the generation in the coil 17 of the induced voltage that corresponds to the magnetic flux that occurs concentrically with the electric wire 7 due to the electric current passed through this electric wire 7, it is arranged that the electric current that is flowing be detected.

The current sensor 15, with the axial direction of the coil 17 disposed parallel with the detection surface 25 of the container main body 2, is secured to the container main body 2, between the plate electrode 12 and the container main body 2, by using an attaching member not illustrated. Incidentally, when attaching to the side surface of the transmission steel tower 4, consideration is given so that the axial direction of the coil 17 may be tangential to the magnetic flux generated concentrically with the electric wire 7.

Further, regarding the surface layer of the detection surface 25 of the container main body 2 disposed opposing the electric wire 7, as in the case of the second embodiment, it is formed by forming, using the method of coating, adhesion, etc., the water-repellent layer 26 that consists of a water-repellent material, such as PTFE, the angle of contact with water of which is 90° or more (more preferably 100° or more). Incidentally, the water-repellent layer 26 may be formed on a surface other than the detection surface 25 of the container main body 2.

Also, on the surface of the detection surface 25, there are provided the rib portions 33 that are parallel with the surface of the earth and that consecutively protrude. These ribs 33 can be formed using the same water-repellent resin as the water-repellent layer 26 or the same material as that of the container main body 2. Further, the height of the rib portion 33 that covers from the intersection thereof with the water-repellent layer 26 to a forward end thereof is formed to a height that is greater than that of an ordinary one of the water-repellent layer. Although this height can be arbitrarily set, for example, it can be set to 5 mm to 80 mm (preferably 6 mm to 50 mm, or more preferably 8 mm to 40 mm).

(2) Effect of Noncontact Sensor

In the noncontact sensor, as well, of the third embodiment, as in the case of the second embodiment, owing to the water repellency of the water-repellent layer 26 provided on the surface of the detection surface 25 of the container main body 2 the rain water of the rain fall is brought to a state of water droplet and falls down. So, no water film layer is formed. Therefore, the rainwater becomes connected to the other surface of the container main body 2 and to the lid member 3 to become conductive. As a result of thereof it is possible to prevent the deterioration of the detection performance of the voltage sensor 11. Also, even when using the synthetic resin inferior in water repellency to the water-repellent layer 26 as the material of the container main body 2, due to the fall of rain the water film layer having the earth potential is not formed on the whole outside surface of the container main body 2. Therefore, even in a rainy weather, the line voltage of the electric wire 7 can be detected by the plate electrode 12 as in a fine weather. Especially, even at the time of a violent thunderstorm where a thunder surge failure occurs, detection becomes able to be performed, so that standardizing of the place where a thunderbolt has fallen can be done by detecting the thunder surge failure signal that follows the thunderstorm.

Also, since the sensor is equipped with the rib portions 33, even in a case where the water film layer has been primarily formed on the water-repellent layer 26 with a very large amount of droplets, it is segmented or divided. Accordingly, without the water film layer's being formed on the entire surface of the water-repellent layer 26, the line voltage of the electric wire 7 can be detected by the plate electrode 12 as in a fine weather.

4. FOURTH EMBODIMENT

Figure 7:
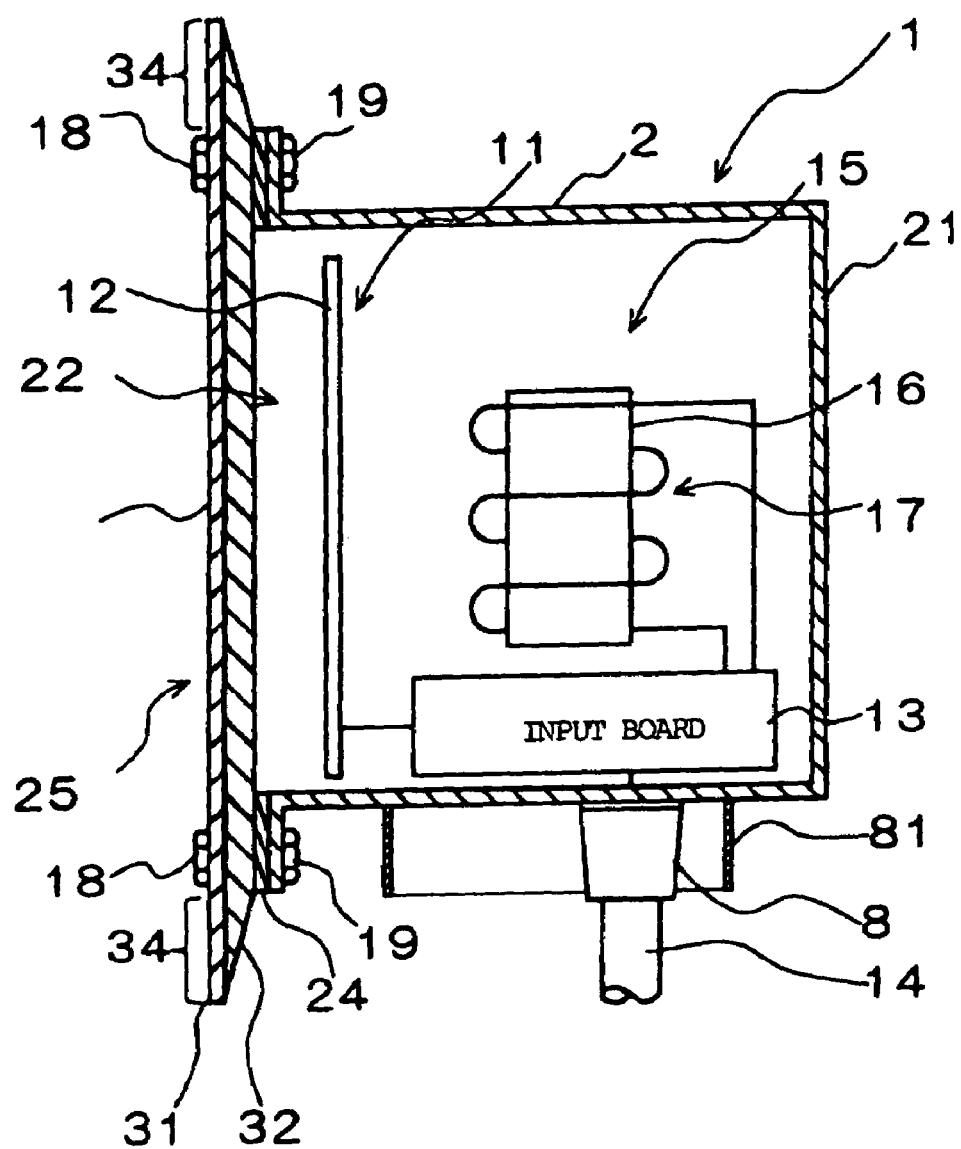
FIG. 7 is a typical sectional view illustrating the structure of a noncontact sensor according to a fourth embodiment of the present invention.

The noncontact sensor of the fourth embodiment is a noncontact sensor in which, as illustrated in FIG. 7, the peripheral edge of the lid member is made to protrude from the attaching portion to thereby make the thickness thinner.

The present noncontact sensor is the noncontact sensor in which the peripheral edge of the lid member 3 of the second embodiment is greatly more extended than the container main body 2 to thereby form an extended portion 34. Also, since the constituent elements excluding the lid member 3 are the same as those in the second embodiment, explanation of these elements is omitted.

The lid member 3 of the fourth embodiment is comprised of the water-repellent layer 31 constructed using a PTFE plate and the non-water-repellent layer 32 constructed using insulative synthetic resin such as vinyl chloride resin, etc. Also, the lid member 3 has the extended portion 34 that is more extended than the portion at which the lid member 3 is fixed to the container main body 2 by the bolt 18 and nut 19. This extended portion 34 is extended, for example, by 5 mm to 80 mm (preferably 6 mm to 50 mm, or more preferably 8 mm to 40 mm), from the portion at which the lid member 3 is fixed to the container main body 2 by the bolt 18 and nut 19. Also, this sensor is constructed in the way in which the forward end of the non-water-repellent layer 32 is made thinner and this layer is thereby tapered. And, the thickness of the peripheral edge of the lid member 3 is made 0.5 mm to 10 mm (preferably 0.7 mm to 8 mm, or more preferably 1 mm to 5 mm).

In case of the above-described extended portion 34, even if water droplets attach in such a way as to bridge the peripheral edge of the lid member 3, because the extended portion 34 has a significantly large length, they are difficult to contact with the container main body 2. As a result thereof, it is possible to prevent the container main body 2 and the lid member 3 from having the same potential. In addition, because the thickness of the peripheral edge of the lid member 3 is thin, the water droplet the ordinary diameter of which is from 2 mm to 3 mm and, in case of the violent rain fall such as thunderstorm, etc., is to an extent of approximately 5 mm or so, is easily segmented or divided, so that its bridged status can be broken off.

5. FIFTH EMBODIMENT

Figure 8:
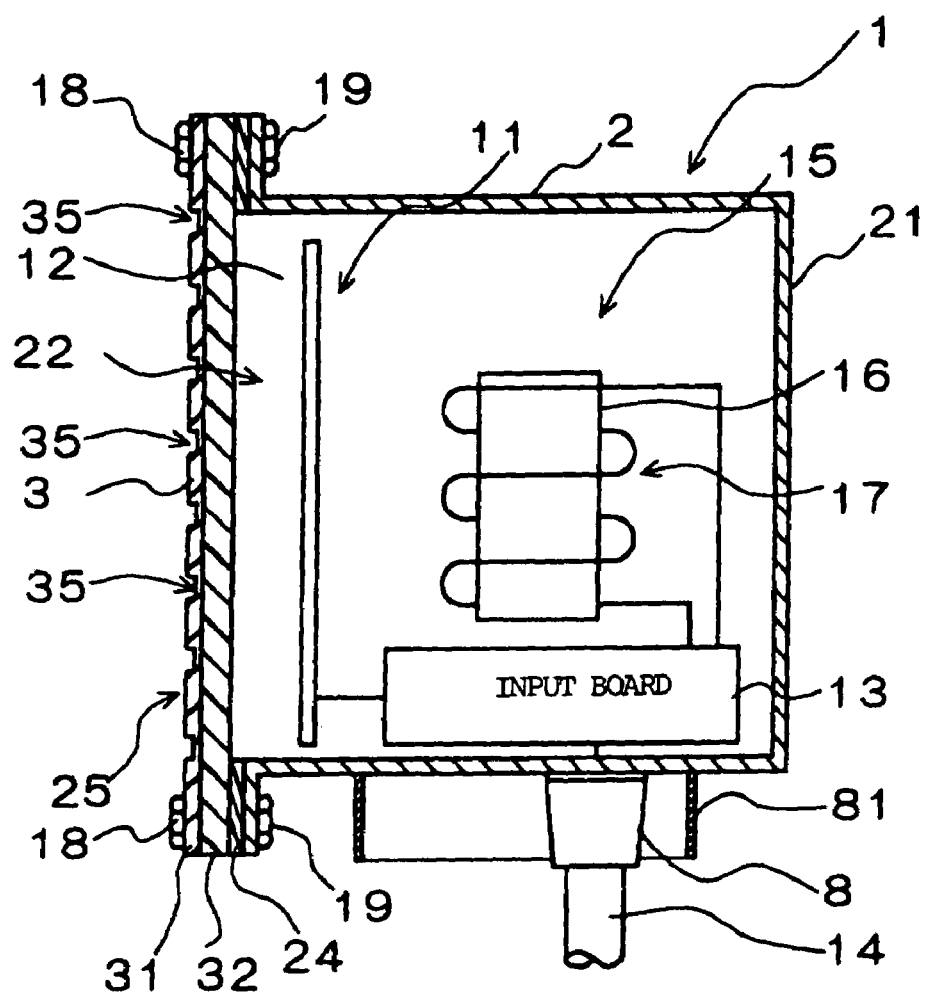
FIG. 8 is a typical sectional view illustrating the structure of a noncontact sensor according to a fifth embodiment of the present invention.

The noncontact sensor of the present fifth embodiment is the one in which, as illustrated in FIG. 8, the groove portions 35 are provided to the water-repellent layer 26 of the lid member 3 of the noncontact sensor illustrated in the second embodiment. Also, on the obverse surface of the detection surface 25 there are provided the groove portions 35 provided parallel with the earth. Although the width of the groove portion 35 can arbitrarily be set, it is preferable that that width be greater than the diameter of the ordinary water droplet. This width can be made, for example, 5 mm to 20 mm (preferably 5.5 mm to 15 mm, or more preferably 6 to 13 mm).

Because of having the above-described groove portions 35, even in a case where a water film layer has primarily been formed on the water-repellent layer 26 owing to a very large amount of water droplet, because it is segmented by the groove portions 35, the water film layer is not formed on the entire surface of the water-repellent layer 26. For this reason, it is possible to detect the line voltage of the electric wire 7, as in a fine weather, by the plate electrode 12.

Incidentally, in the present invention, it is not limited to the embodiments that have exemplified as above but permits various changes or modifications to be made, the purposes, the uses, etc. thereof, without departing from the technical scope of the invention. Although the first embodiment is equipped with only the voltage sensor, the invention is not limited thereto but can be equipped with the current sensor illustrated in the second to the fifth embodiments.

Regarding the rib portions 33 provided in the third embodiment, the invention is not limited to this third embodiment but can be used by being provided on the lid member 3 of the first, second, and fourth embodiments. Also, although the rib portion 33 is provided in parallel with the earth, the invention is not limited thereto. It can be provided at an arbitrary angle, such as in parallel with a direction perpendicular to the earth. Further, a plurality of the rib portions may be provided in the way of their intersecting one another like in the form of a grating or the like.

Regarding the groove portion 35 provided on the fifth embodiment, the invention is not limited to the fifth embodiment but can also be used by being provided on the noncontact sensor of the first, second, and fourth embodiments. Further, the noncontact sensor of the invention can also be made the one that is equipped with both of the rib portions 33 and groove portions 35. Also, regarding the groove portion 35, it can be provided at an arbitrary angle such as perpendicularly to the earth. Further, a plurality of the groove portions may be provided in such a way as to intersect as in the form of a grating or the like.

The invention claimed is:

1. A noncontact sensor comprising a container including a container main body having an opening portion at one side and an insulative lid member that hermetically seals said opening portion of said container main body, and a voltage sensor disposed in said container in the way in which a lid member side is opposed to an electrically charged portion of an overhead wire line, being insulated from the earth, and detecting a voltage that is induced in a plate electrode due to a spatial charge between said electrically charged portion and the plate electrode within said container,
   characterized in that said lid member is a water-repellent resin.

2. A noncontact sensor comprising a container including a container main body having an opening portion at one side and an insulative lid member that hermetically seals said opening portion of said container main body, and a voltage sensor disposed in said container in the way in which a lid member side is opposed to an electrically charged portion of an overhead wire line, being insulated from the earth, detecting a voltage that is induced in a plate electrode due to a spatial charge between said electrically charged portion and the plate electrode within said container,
   characterized in that said lid member has a structure in which a water-repellent layer constructed using a water-repellent resin is provided on the whole or a part of its at least exposed surface.

3. The noncontact sensor according to claim 2, wherein said water-repellent layer is formed with the use of a coating technique.

4. The noncontact sensor according to claim 2, wherein that said water-repellent layer is formed by adhering a sheet-like member or plate-like member consisting of said water-repellent resin.

5. The noncontact sensor according to any of claims 1 to 4, wherein said water-repellent resin is fluorine resin or silicone resin.

6. The noncontact sensor according to claim 5, wherein said lid member is designed in the way in which its peripheral edge is outwardly extended from a joined portion thereof to said container main body.

7. The noncontact sensor according to according to claim 5, wherein said lid member further includes one, or two or more, consecutively protruding rib portions and/or groove portions.

8. A noncontact sensor comprising a container that is equipped with a container main body constructed in the way in which a surface excluding a detection surface opposed to an electrically charged portion of an overhead wire line is electro-magnetically shielded and a voltage sensor that is disposed in said container in the way in which said detection surface is opposed to the electrically charged portion of the overhead wire line, said voltage sensor being insulated from the earth to detect a voltage that is induced in a plate electrode due to a spatial charge between said electrically charged portion and the plate electrode within said container,
   characterized in that said detection surface has a structure in which a water-repellent layer constructed using a water-repellent resin is provided on the whole or a part of its at least exposed surface.

9. The noncontact sensor according to claim 8, wherein said water-repellent resin is fluorine resin or silicone resin.

10. The noncontact sensor according to claim 8 or 9, wherein said detection surface further includes one, or two or more, consecutively protruding rib portions and/or groove portions.

* * * * *